(12) United States Patent
Esterl et al.

(10) Patent No.: US 6,515,890 B2
(45) Date of Patent: Feb. 4, 2003

(54) INTEGRATED SEMICONDUCTOR MEMORY HAVING MEMORY CELLS WITH A FERROELECTRIC MEMORY PROPERTY

(75) Inventors: Robert Esterl, München (DE); Helmut Kandolf, München (DE); Heinz Hönigschmid, East Fishkill, NY (US); Thomas Röhr, Aschheim (DE)

(73) Assignee: Infineon Technologies AG, Munich (DE)

( * ) Notice: Subject to any disclaimer, the term of this patent is extended or adjusted under 35 U.S.C. 154(b) by 148 days.

(21) Appl. No.: 09/780,305

(22) Filed: Feb. 9, 2001

(65) Prior Publication Data

US 2001/0038561 A1 Nov. 8, 2001

(30) Foreign Application Priority Data

Feb. 9, 2000 (DE) .......................................... 100 05 619

(51) Int. Cl.⁷ ................................................ G11C 11/22
(52) U.S. Cl. ............................ 365/145; 365/63; 365/65; 365/214; 365/229
(58) Field of Search ............................. 365/63, 65, 145, 365/214, 229

(56) References Cited

U.S. PATENT DOCUMENTS 6,262,910 B1 * 7/2001 Takata et al. ................ 365/117

FOREIGN PATENT DOCUMENTS

DE 198 32 994 A1 1/2000

* cited by examiner

Primary Examiner—Richard Elms
Assistant Examiner—VanThu Nguyen
(74) Attorney, Agent, or Firm—Laurence A. Greenberg; Werner H. Stemer; Gregory L. Mayback

(57) ABSTRACT

An integrated semiconductor memory has memory cells with a ferroelectric memory property. The memory cells are in each case connected between a column line and a charge line. The column line is connected to a read amplifier which supplies an output signal. The charge line is connected to a driver circuit which provides the charge line with a given potential. In an inactive mode, the column line and the charge line are jointly connected to a connection for a common supply potential in the read amplifier or in the driver circuit. As a result, a relatively quick equalization of a potential between the lines is possible. Thus, unintended changes in the memory cell content due to interfering voltages are avoided.

5 Claims, 2 Drawing Sheets

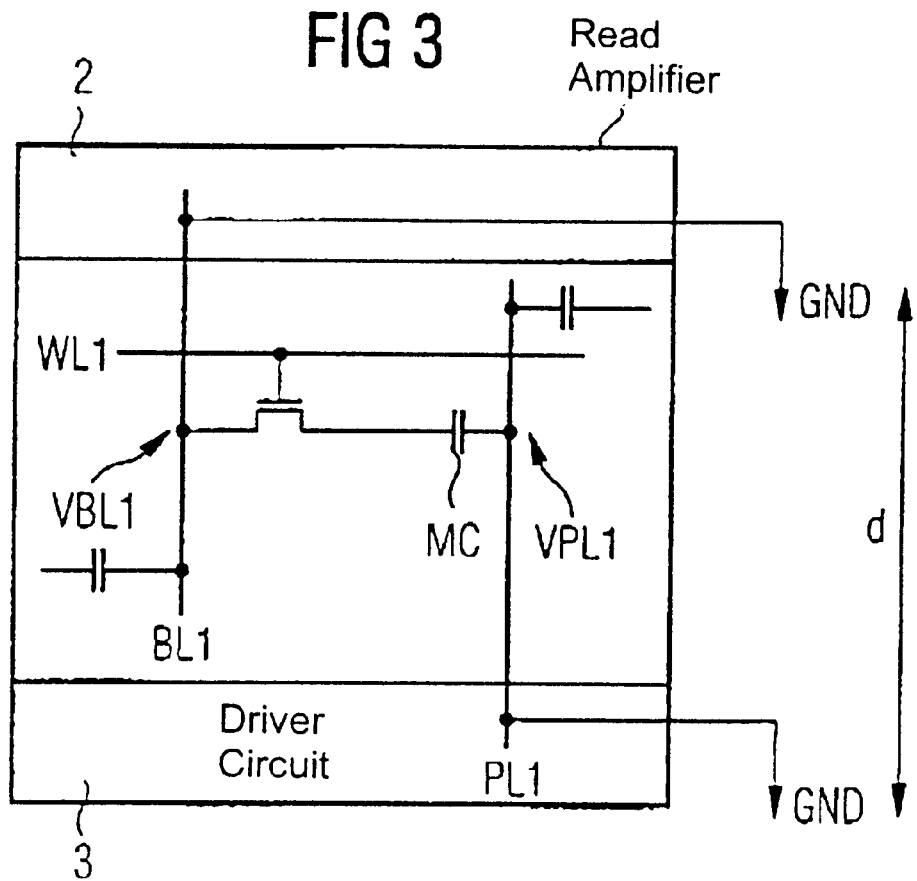
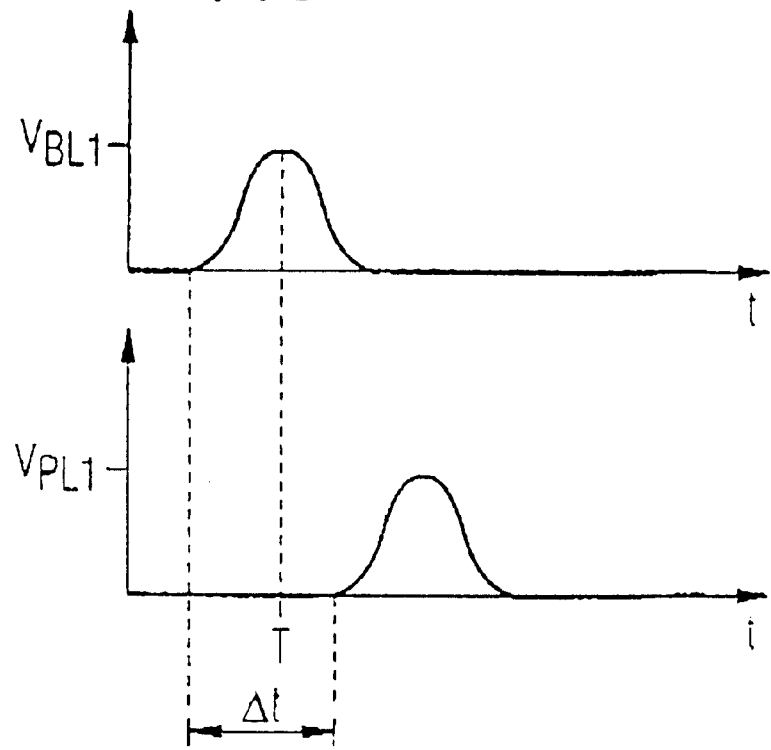

INTEGRATED SEMICONDUCTOR MEMORY HAVING MEMORY CELLS WITH A FERROELECTRIC MEMORY PROPERTY

BACKGROUND OF THE INVENTION

Field of the Invention

The invention relates to an integrated semiconductor memory having memory cells with a ferroelectric memory property. The integrated semiconductor memory has a memory cell field with row lines for selecting memory cells and column lines for reading or writing data signals of the memory cells. The memory cells are in each case connected between one of the column lines and a charge line. The column line is connected to a read amplifier and the charge line is connected to a driver circuit which provides the charge line with a given potential. The column line and the charge line each have an active mode and an inactive mode.

Integrated semiconductor memories having so-called FeRAM memory cells (Ferroelectric Random Access Memory) which have a ferroelectric memory property are often constructed in a similar manner as, for example, DRAMs (Dynamic Random Access Memory). Memory cells in DRAMs are usually combined in a matrix-type memory cell array to form units of column lines and row lines. The column lines are generally connected to a read amplifier at which a data signal to be read out and amplified can be picked up.

In memory cells having a ferroelectric memory property, it is known that data signals are stored in the memory cell in the form of distinguishable polarization states of the material. In the operation of the semiconductor memory, the memory cells generally have a capacitive behavior. Semiconductor memories having such memory cells are known, for example, as so-called FeRAMs. The memory cells are usually connected between one of the column lines and a charge line also called a "plate". This charge line is in most cases connected to a driver circuit through the use of which the charge line is at a given potential.

When operating the semiconductor memory, the column lines and the charge lines of the memory in each case have an active mode and an inactive mode. In the active mode, in which, for example, the content of a memory cell is read out, the corresponding column line is connected to a read amplifier and the charge line is at a given potential. In the inactive mode, the corresponding column lines and the charge lines are generally connected to a connection for a common supply potential.

This is necessary in order to prevent an unintended change of the content of a memory cell, for example due to interfering voltages. Such interfering voltages are produced, for example, by a signal being coupled from an active row line into an inactive charge line. With an active row line, the selection transistor between the memory cell and the relevant column line is in the conducting state. It is essential, especially in this operating state, for an inactive column line and an inactive charge line to have the same potential so that the two poles of the connected memory cell are at the same potential.

The column lines and charge lines which are in an inactive mode are frequently connected to a common voltage network. Such a voltage network generally has comparatively large line capacitances and line resistances caused by relatively large dimensions and line lengths. If, for example, interfering voltages are produced on an inactive column line along an active row line, for example by a signal being coupled in, it is possible that unwanted potential differences occur between this column line and the charge line of a connected memory cell. This is the case, in particular, if the connections of the column line and of the charge line to the voltage network for the common supply potential are spatially separate, that is to say, for example, are connected in different circuit parts of the semiconductor memory. Due to comparatively large line capacitances and line resistances of the voltage network, a necessary equalization of the potential between these lines is delayed in time. Thus, a short-term or transient potential difference can arise at the poles of the memory cells which are provided along an active row line and can change the content of the memory cells in an unintended manner.

SUMMARY OF THE INVENTION

It is accordingly an object of the invention to provide an integrated memory circuit which overcomes the above-mentioned disadvantages of the heretofore-known integrated memory circuits of this general type and in which the probability of any unintended change in the memory content of a memory cell due to interfering voltages can be kept comparatively small.

With the foregoing and other objects in view there is provided, in accordance with the invention, an integrated semiconductor memory, including:

a memory cell having a ferroelectric memory property;

a memory cell array including a row line for selecting the memory cell and a column line for reading data signals from the memory cell and writing data signals to the memory cell;

a charge line;

the memory cell being connected between the column line and the charge line;

a read amplifier connected to the column line, the read amplifier supplying an output signal;

a driver circuit connected to the charge line for providing a given potential to the charge line;

a connection for providing a common supply potential; and the column line and the charge line each having an active operation mode and an inactive operation mode, and, when in the inactive operation mode, the column line and the charge line being jointly connected, in the read amplifier or in the driver circuit, to the connection for providing the common supply potential.

In other words, the object of the invention is achieved by an integrated semiconductor memory having memory cells with a ferroelectric memory property, having a memory cell array which has row lines for selecting memory cells and column lines for reading or writing data signals of the memory cells, in which the memory cells are in each case connected between one of the column lines and a charge line; in which the column line is connected to a read amplifier at which an output signal can be picked up; in which the charge line is connected to a driver circuit through the use of which the charge line can be placed at a predetermined potential; in which the column line and the charge line in each case have an active mode or an inactive mode; in which, in the inactive mode, the column line and the charge line are connected to a connection for a common supply potential; and in which the column line and the charge line are jointly connected to the connection for the supply potential in the read amplifier or in the driver circuit.

Due to the fact that the column line and the charge line are jointly connected to the connection for the common supply potential in the read amplifier or in the driver circuit, the corresponding column line and charge line are connected to the common supply potential in relative proximity to one another. This prevents comparatively large line capacitances and line resistances which are caused by comparatively large dimensions and line lengths of the voltage network. As a result, a relatively quick equalization of potential between the lines is possible in the case where interfering voltages are coupled into the relevant column line and/or charge line. Potential differences at the poles of a memory cell which is connected to an inactive column line and an active row line are kept comparatively small. This prevents any unintended change in the memory content of a memory cell due to interfering voltages.

The invention can be applied, in particular, to a semiconductor memory which is operated with a so-called Pulsed-Plate concept (PPL concept). During a read cycle for reading out a data signal from a memory cell, for example, the relevant column line has an active mode. The column line is connected to the read amplifier at which the data signal can be picked up. The relevant charge line is at a predetermined potential due to the driver circuit. This potential corresponds, for example, to the positive supply potential of the semiconductor memory. In the inactive mode, the relevant column line is separate from the read amplifier and, together with the charge line, connected to the connection for the common supply potential. This supply potential is, for example, a reference potential of the integrated semiconductor memory. Thus, according to a preferred feature of the invention, the connection provides, as the common supply potential, a reference potential for an integrated semiconductor memory.

According to a further feature of the invention, a first switching device is provided, the column line and the charge line being connected to one another via the first switching device; a second switching device is provided, the column line or the charge line being connected to the connection for the common supply potential via the second switching device, the connection for providing the common supply potential being a first connection; and a second connection is provided for supplying a common control signal, the first switching device having a first control connection, the second switching device having a second control connection, the first control connection and the second control connection being connected to the second connection for providing the common control signal.

In other words, the column line and the charge line are connected to one another via a first switching device, the column line or the charge line is connected to the connection for the supply potential via a second switching device. In this configuration, a control connection of the first switching device and a control connection of the second switching device are connected to the connection for a common control signal. This embodiment provides the possibility of a quick equalization of potential in the case of interfering voltages being coupled in, since the relevant column line and the charge line are short-circuited via the first switching device. Both lines are jointly connected to the connection for the supply potential via a common drive of the first switching device and the second switching device.

According to yet another feature of the invention, a third connection for a column select signal is provided; a fourth connection for a row select signal is provided; and a processing unit having an input side connected to the third connection and to the fourth connection is provided, and the processing unit has an output side connected to the first control connection and to the second control connection.

In other words, according to this embodiment of the invention, the integrated semiconductor memory has a processing unit, which is connected at its input to a connection for a column select signal and to a connection for a row select signal. The processing unit is connected at its output to the control connection of the first switching device and to the control connection of the second switching device. The column select signal is generated, for example, by a column decoder for selecting one of the column lines. The row select signal is generated, for example, by a row decoder. Floating states on the column line in other areas of the memory cell array are prevented by logically combining information from the column decoding and row decoding.

According to another feature of the invention, the processing unit includes a logic NAND gate.

The memory cell array is usually subdivided into a number of blocks which in each case include a number of row lines. During a memory access, only the memory cells within a selected block of the memory cell array are generally activated along she selected column line. Driving the processing unit with the row select signal makes it possible to connect the selected column line to the connection for the supply potential in the remaining inactive areas of the memory cell array. A floating state of a selected column line is thus prevented in these memory areas.

Other features which are considered as characteristic for the invention are set forth in the appended claims.

Although the invention is illustrated and described herein as embodied in an integrated semiconductor memory having memory cells with a ferroelectric memory property, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic circuit diagram of a memory cell array having separate potential connections; and FIG. 4 is a graph illustrating an interfering voltage on a column line and on a charge line.

DESCRIPTION OF THE PREFERRED EMBODIMENTS

Figure 1:
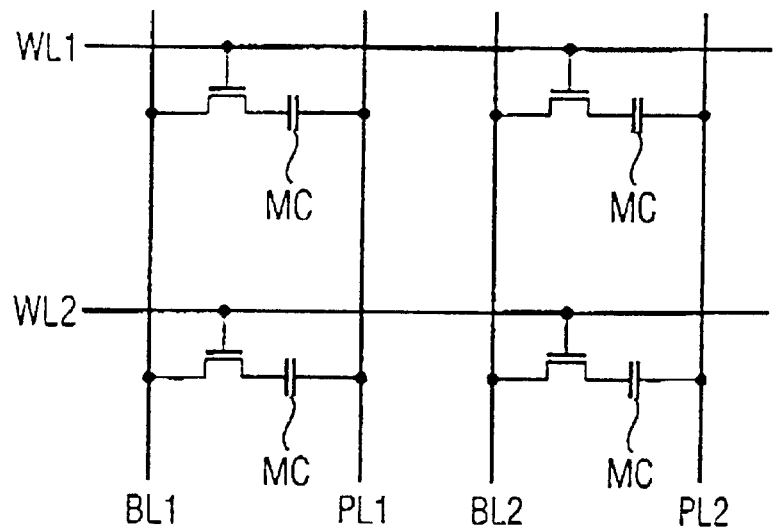
FIG. 1 is a schematic circuit diagram of a memory cell array of a semiconductor memory.

Referring now to the figures of the drawings in detail and first, particularly, to FIG. 1 thereof, there is shown a memory cell array of a semiconductor memory which has memory cells MC having a ferroelectric memory property or ferroelectric memory effect, which are combined to form units of column lines BL1 and BL2 and row lines WL1 and WL2. The memory cells MC are connected between the column line BL1 and the charge line PL1 or, respectively, between the column line BL2 and charge line PL2. The charge lines PL1 and PL2 are generally referred to as so-called "plates."

FIG. 3 shows a diagrammatic representation of the memory cell array in which the column line 3L1 and the plate PL1 are connected to separate potential connections for a supply potential GND. The column line BL1 and the plate PL1 are in an inactive mode. The column line BL1 is connected to a read amplifier 2 and connected to a connection for a reference potential GND. The plate PL1 is connected to a driver circuit 3 which is used for connecting a potential for the various operating modes of the plate PL1. In the inactive mode, the plate PL1 is also connected to a connection for the reference potential GND. In FIG. 3, it is assumed that the connections for the reference potential GND of the column line BL1 and the plate PL1 are at a relatively large distance from one another. This distance d is, for example, d=0.5 mm.

FIG. 4 is a signal diagram which represents an interfering voltage $V_{BL1}$ on the column line BL1 which was generated, for example, by being coupled into the column line BL1. This interfering voltage $V_{BL1}$ is transferred to the charge line PL1 ($V_{PL1}$). The reference voltage network represents a comparatively large line capacitance and a comparatively large line resistance. The column line BL1 is therefore short-circuited to the charge line PL1 with a time delay $\Delta t$. At the poles of the memory cell MC which is connected to a selected row line WL1, a potential difference of the magnitude of the interfering voltage $V_{BL1}$ occurs, for example at a time T. The consequence can be an unintended change in the memory content of the memory cell MC.

Figure 2:
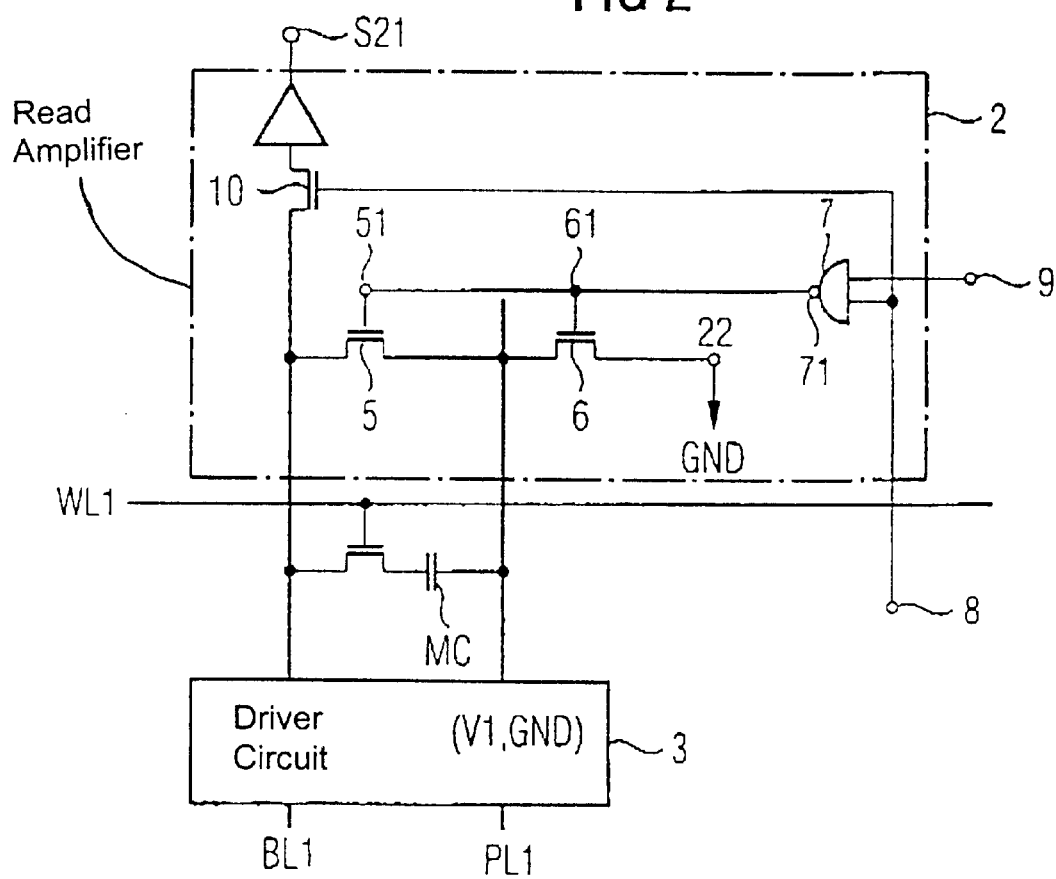
FIG. 2 is a schematic circuit diagram of an embodiment of the semiconductor memory according to the invention.

FIG. 2 shows an embodiment of the semiconductor memory according to the invention. The column line BL1 is connected to a read amplifier 2 at which an output signal S21 can be picked up. The plate PL1 is connected to a driver circuit 3 which is used for connecting, for example, a positive supply potential V1 or for connecting a reference potential GND.

The column line BL1 and the plate PL1 are connected to one another via a switching device 5. In this exemplary embodiment, the plate PL1 is connected to the connection 22 for the supply potential GND via a second switching device 6. The switching devices 5 and 6 are here constructed as transistors. It is also possible that, instead of the plate PL1, the column line BL1 is connected to the connection 22 for the reference potential GND via the switching device 6. The control connection 51 of the switching device 5 and the control connection 61 of the switching device 6 are connected to the connection 71 for a common control signal.

The semiconductor memory also has a processing unit 7, the input of which is connected to a connection 8 for a column select signal and to a connection 9 for a row select signal. At the output end, the processing unit 7 is connected to the control connection 51 and the control connection 61. The processing unit 7 is here constructed as a NAND gate.

Below, the operation of the semiconductor memory shown in FIG. 2 will be explained in greater detail. The semiconductor memory shown operates in accordance with the so-called pulsed-charge line or pulsed-plate (PPL) concept. During a memory access, the column select signal at connection 8 is in an active state (high). In addition, the row select signal at connection 9 has an active state so that the conducting connection via the switching devices 5 and 6 is interrupted. The row line WL1 is selected. The column line BL1 is connected to the read amplifier 2 via the transistor 10 for reading and amplifying the data signal to be read out from the memory cell MC. At the same time, the voltage V1 is applied to the charge line PL1 by the driver circuit 3.

When no memory access is performed, the column select signal at connection 8 has an inactive state. This state corresponds, for example, to a reference potential so that the transistor 10 is in the non-conducting state. The column line BL1 and the plate PL1 are connected to the connection 22 for the reference potential GND via the processing unit 7. The processing unit 7 then ensures that the short-circuiting connection between the column line BL1 and the plate PL1 is only interrupted during an active state of the column select signal and an active state of the row select signal. In all other cases, the column line BL1 and the plate PL1 are short-circuited and connected to the reference potential GND.

The row select signal at connection 9 is, for example, a select signal for selecting a memory cell block which includes a number of row lines. During a memory access, generally only one memory cell block is activated. If the column line BL1 is in the active mode due to an active select signal at connection 8, floating states of the active column line BL1 in other inactive memory cell blocks are prevented due to the logical combination with the row select signal at connection 9.

In the circuit configuration according to FIG. 2, the column line BL1 and the plate PL1 are jointly connected to connection 22 for the supply potential GND in the read amplifier 2. However, it is also possible for the column line BL1 and the plate PL1 to be jointly connected to the connection 22 for the supply potential GND in the driver circuit 3. In both cases, the order of magnitude of the short-circuiting connection between the lines is reduced, for example, to d=1 $\mu$m to 10 $\mu$m.

We claim:

1. An integrated semiconductor memory, comprising:
    a memory cell having a ferroelectric memory property;
    a memory cell array including a row line for selecting said memory cell and a column line for reading data signals from said memory cell and writing data signals to said memory cell;
    a charge line;
    said memory cell being connected between said column line and said charge line;
    a read amplifier connected to said column line, said read amplifier supplying an output signal;
    a driver circuit connected to said charge line for providing a given potential to said charge line;
    a connection for providing a common supply potential; and
    said column line and said charge line each having an active operation mode and an inactive operation mode, and, when in the inactive operation mode, said column line and said charge line being jointly connected, in one of said read amplifier and said driver circuit, to said connection for providing the common supply potential.

2. The integrated semiconductor memory according to claim 1, wherein said connection provides, as the common supply potential, a reference potential for an integrated semiconductor memory.

3. The integrated semiconductor memory according to claim 1, including:
    a first switching device, said column line and said charge line being connected to one another via said first switching device;
    a second switching device, one of said column line and said charge line being connected to said connection for the common supply potential via said second switching device, said connection for providing the common supply potential being a first connection; and a second connection for providing a common control signal, said first switching device having a first control connection, said second switching device having a second control connection, said first control connection and said second control connection being connected to said second connection for providing the common control signal.

4. The integrated semiconductor memory according to claim 3, including:

a third connection for a column select signal;

a fourth connection for a row select signal; and a processing unit having an input side connected to said third connection and to said fourth connection, and said processing unit having an output side connected to said first control connection and to said second control connection.

5. The integrated semiconductor memory according to claim 4, wherein said processing unit includes a logic NAND gate.

* * * * *